United States Patent [19]

Kindinger et al.

[11] Patent Number: 4,609,884
[45] Date of Patent: Sep. 2, 1986

[54] LEVEL CONTROL FOR A VOLTAGE CONTROLLED OSCILLATOR

[75] Inventors: Peter A. Kindinger, Lake in the Hills; Einar A. Eriksson, Oak Park, both of Ill.

[73] Assignee: Motorola, Inc., Schaumburg, Ill.

[21] Appl. No.: 731,205

[22] Filed: May 6, 1985

[51] Int. Cl.⁴ .......................... H03B 5/12; H03L 5/00
[52] U.S. Cl. .............................. 331/109; 331/117 FE; 331/177 V; 331/183
[58] Field of Search ................. 331/36 C, 109, 117 R, 331/117 FE, 177 R, 177 V, 183; 334/15

[56] References Cited

U.S. PATENT DOCUMENTS

| | | | |
|---|---|---|---|
| 3,416,096 | 12/1968 | Kim | 331/117 FE X |
| 3,739,279 | 6/1973 | Hollis | 331/177 V X |
| 3,959,744 | 5/1976 | O'Connor | 331/116 R |
| 4,353,038 | 10/1982 | Rose et al. | 331/36 C |
| 4,450,416 | 5/1984 | Mears | 331/117 FE |
| 4,454,485 | 6/1984 | Fisher | 331/109 |

*Primary Examiner*—Siegfried H. Grimm
*Attorney, Agent, or Firm*—Donald B. Southard; Thomas G. Berry

[57] ABSTRACT

A voltage controlled oscillator is disclosed wherein a peak detector is used to control the gain of the active device within the oscillator in response to a control signal taken from the resonant circuit. The control signal is a RF potential developed across a voltage divider within the resonant circuit. By controlling the gain of the active device from an RF voltage provided by a voltage divider, the RF output level of the oscillator "tracks" the DC bias level of the steering line. Therefore, varactor diodes rectification is prevented while contemporaniously allowing maximized output power.

4 Claims, 4 Drawing Figures.

LEVEL CONTROL FOR A VOLTAGE CONTROLLED OSCILLATOR

BACKGROUND OF THE INVENTION

This invention relates generally to voltage controlled oscillators and more particularly to voltage controlled oscillators having an automatic gain control circuit.

Those skilled in the art will appreciate that frequency synthesizers have become the preferred means of frequency generation in most radio transceiver applications. The heart of a frequency synthesizer is the voltage controlled oscillator (VCO). Of course, the basic operation of a VCO, that is, to provide a changing frequency depending upon an applied voltage (commonly referred to as a steering line voltage), is widely known. Historically, early VCO's had very limited tuning ranges or bandwidths. As technology advanced, wider bandwidth VCO's became available and the trend today is to provide even broader bandwidths.

A significant problem encountered when trying to increase the tuning range for a VCO is varactor diode rectification at low steering line voltages. As is well known in the art, the frequency of a VCO is varied by changing the capacitance of one or more varactor diodes, which in turn changes the resonant frequency of a resonant circuit formed by the varactors and associated inductive and capacitive elements. However, to be effective, the peak radio frequency (RF) voltage across the varactor diodes should be less than the rectification level under all DC bias conditions (including temperature and transient effects). If the peak RF voltage across the varactors becomes greater than the DC reverse bias level, the varactors will become forward biased for a portion of the RF waveform cycle leading to rectification spurs and a degradation in sideband noise performance of the VCO.

To correct this problem, some VCO's have employed automatic gain control (AGC) circuits wherein the output level of the VCO is held constant. This is generally accomplished by detecting the output level of the VCO and providing a feedback signal to adjust the gain of the oscillator. Once the output level is established, the minimum steering line voltage can be set greater than the peak RF voltage level to prevent rectification. While this technique generally provides satisfactory VCO performance, the limited output level requires subsequent amplification (in a transceiver realization) to provide sufficient power to the mixers or other subsequent circuitry. Thus, limiting the output power of the VCO to improve rectification spur performance is adverse to the overall operation of the frequency synthesizer since the signal must be reamplified, and then relimited, to provide an acceptable signal to the mixer.

SUMMARY OF THE INVENTION

Accordingly, it is an object of the present invention to provide a voltage controlled oscillator that prevents RF rectification while providing a maximized output power level.

In practicing the invention, an RF peak detector is used to control the gain of the active device in an oscillator in response to a control signal taken from the resonant circuit. In the preferred embodiment, the control signal is an RF potential developed across a voltage divider which is formed by the varactor diodes and a fixed capacitor. By controlling the gain of the active device in this manner, the oscillator RF output level "tracks" the DC bias level of the steering line. Thus, at lower steering line voltages the RF output level is contemporaneously reduced. Accordingly, the RF output level will always be less than the steering line voltage preventing RF rectification of the varactors. Further, at higher steering line levels, the output power of the VCO is allowed to correspondingly increase to provide a maximized output power level.

BRIEF DESCRIPTION OF THE DRAWINGS

The features of the present invention which are believed to be novel are set forth with particularity in the appended claims. The invention, together with further objects and advantages thereof, may be understood by reference to the following description taken in conjunction with the accompanying drawings, and the several figures in which like reference numerals identify like elements, and in which:

DESCRIPTION OF THE PRIOR ART

Figure 1:
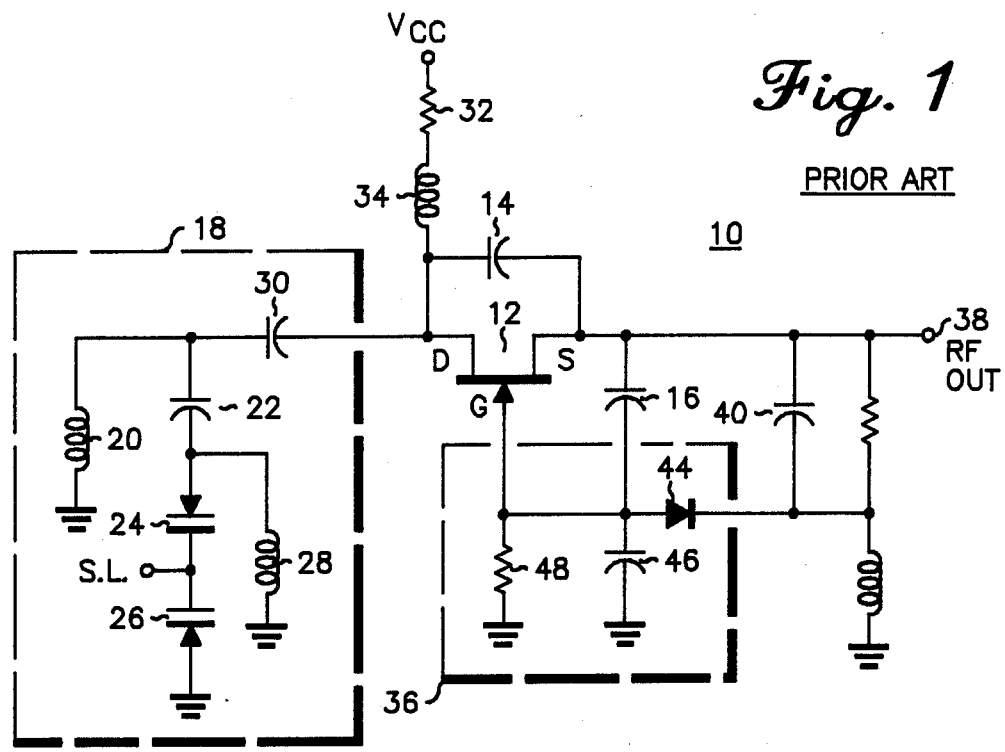
FIG. 1 is a schematic diagram of a typical voltage controlled oscillator circuit having an AGC circuit in accordance with the prior art.

Referring now to FIG. 1, a typical circuit arrangement of the prior art is shown in which a VCO 10 is configured as a Colpitts oscillator which employs a junction field-effect transistor (JFET) 12 having a radio frequency (RF) feedback path from the drain D to the gate G via capacitive elements 14 and 16. Also coupled to the drain D of JFET 12 is an inductive circuit 18.

The inductive circuit 18 includes an inductor 20, capacitors 22 and 30 and varactors 24 and 26. Generally, varactors can be considered as voltage controlled capacitors whose capacitance varies inversely to the DC potential placed across them. Stated alternatively as the voltage across the varactor decreases, its capacitance increases and vice versa. To operate correctly, the varactors are biased, and therefore, must have a DC reference to ground. Accordingly, the varactor 24 is coupled to ground via an RF choke 28 providing the required ground reference. The resonant frequency of VCO 10 is determined by the inductive circuit 18 and capacitive elements 14 and 16. The resonant frequency is controlled by changing the steering line potential which alters the capacitance of the varactors 24 and 26. Thus, when operating, the VCO 10 of FIG. 1 will have a RF voltage appearing across the inductive circuit 18 which is coupled to a JFET amplifier 12.

A common problem with VCO's is rectification of the RF signal ar low steering line voltages. Generally, the peak RF voltage across the varactor diodes should be less than the rectification level under all bias conditions. For example, if the peak RF voltage across the varactors 24 and 26 were, for example, 3 volts, and the steering line voltage was less than 3 volts, the negative excursions of the RF waveform would forward bias the varactors 24 and 26. This condition is generally attributable to a degradation in spur level and unacceptable sideband noise performance.

Accordingly, the VCO 10 of FIG. 1 includes a detecting circuit 36 whose purpose is to monitor the output level of the VCO 10 (at terminal 38) and control the gain of the JFET 12. The output level is measured by the detector 36 by simply peak detecting the RF level provided through a capacitor 40. Accordingly, the peak detector 36 includes a diode 44, a capacitor 46 and a resistor 48. The RF energy is rectified through the diode 44 and stored (or averaged) in capacitor 46 by the discharge time constant established by the capacitor 46 and the resistor 48. Thus, a substantially DC voltage is established across the resistor 48 which varies the gate G to source S voltage of the JFET 12 thereby controlling the gain. For example, as the output level rises, the rectified peaks cause a more negative voltage to appear across the resistor 48. This in turn will cause the gate G to source S potential of the JFET 12 to become more negative, which reduces the gain of the JFET 12. Thus, an equilibrium is rapidly established after oscillator start-up which levels the output at terminal 38 such that the RF voltage is substantially constant.

Once the output level has been limited, the steering line voltage may be set such that it will be above the RF potential under all bias conditions. Care must be taken to insure that this DC potential remains above the RF potential under conditions of temperature and transients. Failure to accurately control the RF rectification will cause spur and sideband noise problems rendering the VCO, and the frequency synthesizer, virtually unuseable.

DETAILED DESCRIPTION OF THE PREFERRED EMBODIMENT

Figure 2:
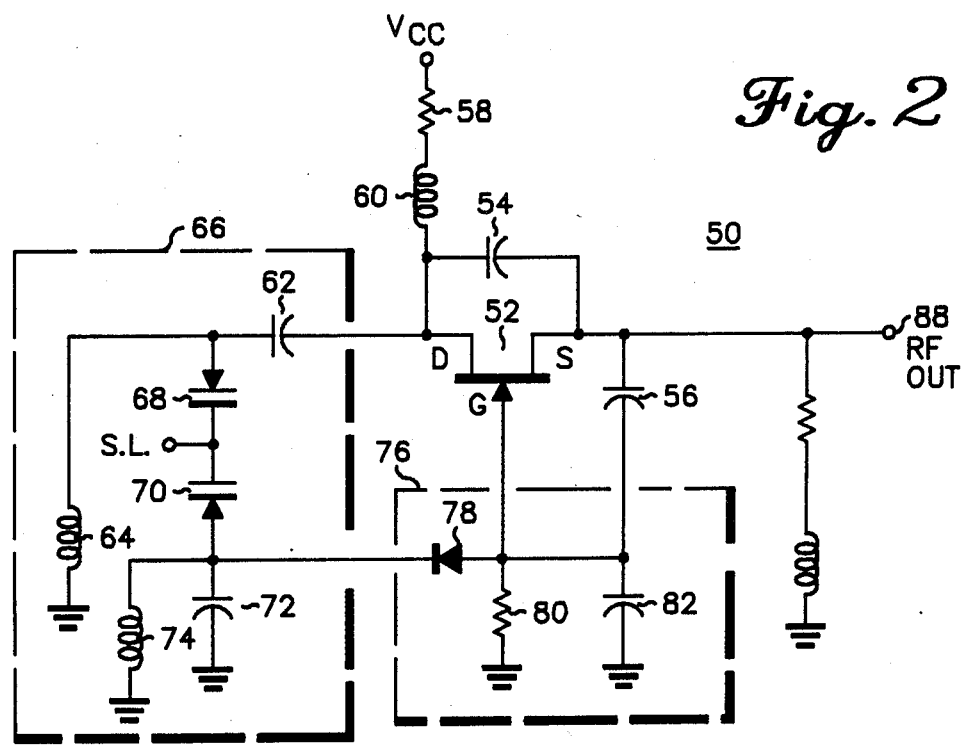
FIG. 2 is a schematic diagram of a voltage controlled oscillator having an improved AGC circuit in accordance with the present invention.

In FIG. 2 the VCO 50 of the present invention is depicted in schematic detail. The VCO 50 of FIG. 2 employs a JFET 52 which has an RF feedback path through the capacitors 54 and 56 which together with an inductive circuit 66 forms a Colpitts oscillator. Bias is supplied to the JFET 52 through a resistor 58 and an RF choke 60.

The inductive circuit 66 includes varactors 68 and 70, capacitors 62 and 72 and an inductor 64, which together with capacitors 54 and 56 determine the resonant frequency of the VCO 50 as is well known in the art. An RF choke 74 provides a DC reference to ground for the varactor 70, to enable proper operation. Although there has been a slight restructuring of the inductive circuit 66 of FIG. 2, as compared to the inductive circuit 18 of FIG. 1, the present invention, without more, would suffer the same detrimental effects at low steering line voltages as the prior art. However, the VCO 50 of the present invention includes a peak detector 76 which is coupled to the junction of the varactor 70 and the capacitor 72. This novel connection controls the gain of the JFET 52 by detecting a portion of the RF voltage across the inductive circuit 66. Considering the varactors 68 and 70 as voltage controlled capacitors, a voltage divider is formed by the varactors 68 and 70 and the capacitor 72. Accordingly, the RF potential across the inductive circuit 66 will be divided between these impedances in accordance to the varying capacitance of the varactors 68 and 70. At high steering line voltages, the varactor capacitance is decreased, which tends to develop less RF potential across capacitor 72. Conversely, at low steering line voltages the varactor capacitance is increased and proportionally more RF voltage tends to occur across the capacitor 72 and is sensed by the detecting circuit 76.

The detecting circuit 76 includes a diode 78, a resistor 80 and a capacitor 82. The function of the detector 76 is to rectify that portion of RF energy provided by the voltage divider established by the varactors 68 and 70 and the capacitor 72. The detector 76 presents a substantially DC potential to the gate G of the JFET 52 establishing the gate G to source S voltage and thereby controlling the gain of the JFET 52. For example, at low steering line voltages, the capacitance of the varactors 68 and 70 will increase presenting a higher RF voltage potential across the capacitor 72 which is detected by the detecting circuit 76. Accordingly, a more negative voltage will be developed across the resistor 80 making the gate G to source S potential of the JFET 52 more negative thereby reducing the gain of the JFET 52. Therefore, as the steering line voltage decreases, the detecting circuit 76 correspondingly decreases the gain of the JFET 52 keeping the RF potential across the varactors 68 and 70 below the DC potential of the steering line. If the steering line voltage was further reduced, the gain would be further decreased keeping the RF potential below the steering line level avoiding any possibility of RF rectification. Conversely, at high steering line voltages, less potential will appear across the capacitor 72. Accordingly, the detector 76 provides a more positive voltage to the gate G of the JFET 52. Accordingly, the gain of the JFET 52 rises causing the RF level of the VCO 50 to increase. As will be seen, the RF output level presented at terminal 88 of the VCO 50 is permitted to rise and fall in a controlled fashion which "tracks" the DC potential of the steering line. The configuration of the present invention affords the dual benefit of having maximized output power (which requires reduced amplification and limiting subsequent to the VCO 50) and preventing RF rectification.

Figure 3:
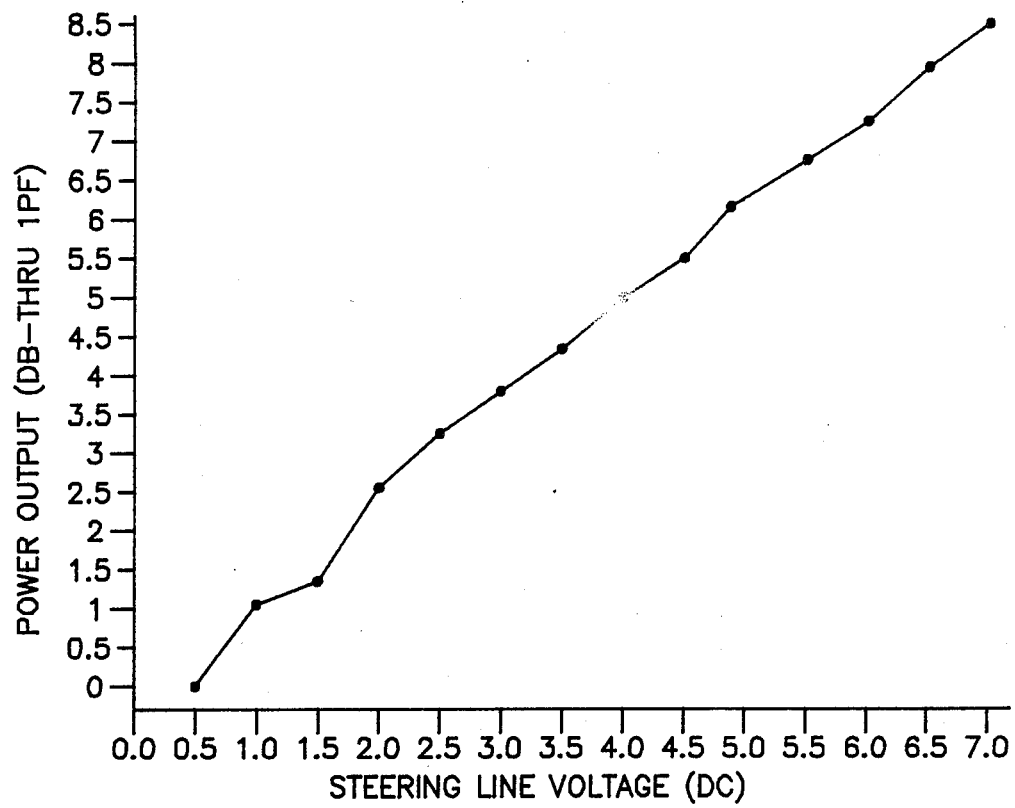
FIG. 3 is a graphical representation of the "tracking" of the RF voltage level to the steering line voltage of the VCO of FIG. 2.

Referring now to FIG. 3, the "tracking" feature of the present invention is depicted in graphical form. At low steering line voltage, for example, 0.5 volts, the output power of the VCO 50 (at terminal 88) would be 0 dB. As the steering line voltage rises, the output level of the VCO 50 is allowed to rise in a controlled manner. Thus, at higher steering line voltages, for example 7 volts, the output level of the VCO 50 would be 8.5 dB. Therefore, the VCO 50 of the present invention maximizes the output level while preventing varactor diode rectification.

Figure 4:
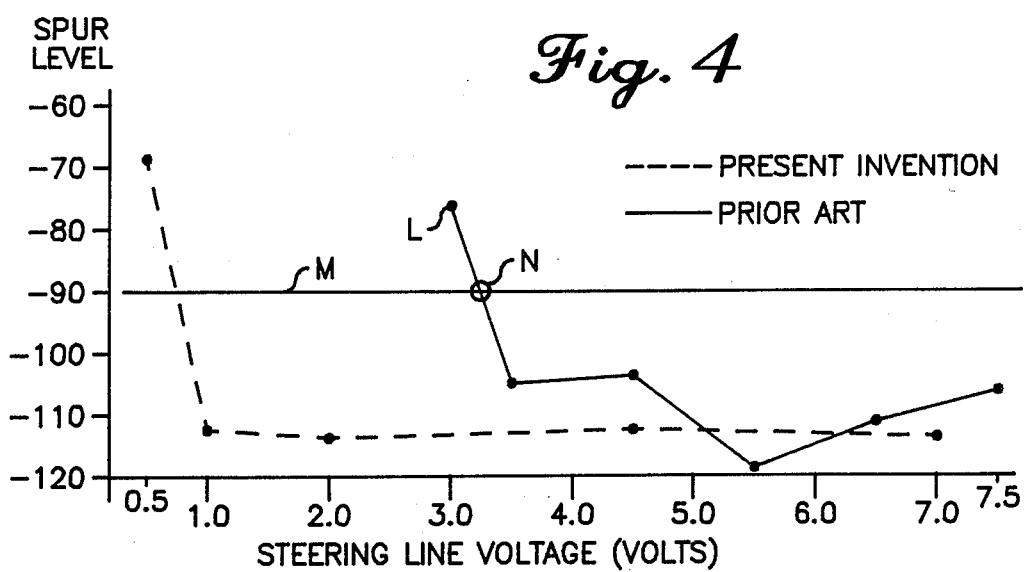
FIG. 4 is a graphical representation comparing the spur performance and tuning range of the prior art and the present invention.

Referring now to FIG. 4, a comparison of the spur performance and tuning range of what may be expected in the prior art, as well as that of the present invention is shown in graphic form. FIG. 4 includes a reference line M which represents the maximum acceptable spur level for a −85 db receiver desensitization specification (at 25 kHz). The spur level of the prior art, represented by the solid line of FIG. 4, shows acceptable spur performance down to 3.25 volts where the curve intersects reference line M at point N. As the prior art steering line voltage is decreased below 3.25 volts, spur performance ceases to be acceptable, and at point L, the prior art VCO 10 (of FIG. 1) ceased to function entirely.

The dashed line of FIG. 4 represents the spur performance of the present invention. The present invention spur performance is generally superior to that of the prior art for all cases down to the 3 volt steering line voltage where the prior art VCO ceased to function. However, the present invention, (VCO 50 of FIG. 2) continues to satisfactorily function down to 0.75 volts. Thus, a 2.5 volt improvement is afforded in the present invention allowing the tuning range to be broadened.

While a particular embodiment of the invention has been described and shown, it should be understood that the invention is not limited thereto since many modifications may be made. It is therefore contemplated to cover by the present application any and all such modifications that may fall within the true spirit and scope of the basic underlying principles disclosed and claimed herein.

What is claimed is:

1. A method of controlling the magnitude of an output signal produced by a voltage controlled oscillator circuit comprised of an active device and capacitive and inductive elements forming a frequency determining means having a voltage control input port for receiving a steering signal, comprising the steps of:
   (a) detecting a radio frequency potential at a node in the circuit that varies inversely proportional to the steering signal;
   (b) rectifying said radio frequency potential to provide a control signal;
   (c) controlling the active device with said control signal to vary the magnitude of the output signal.

2. The method of claim 1, wherein the step of detecting comprises peak detecting said radio frequency potential.

3. The method of claim 1, wherein the step of controlling comprises varying the gain of said active device.

4. An improved voltage controlled oscillator circuit for providing an output signal, said circuit having an active device and capacitive and inductive elements forming a frequency determining means having a voltage control input port for receiving a steering signal, comprising:
   means for detecting a radio frequency potential at a node in the circuit that varies inversely proportional to the steering signal;
   means for rectifying said radio frequency potential to provide a control signal;
   means for controlling the active device with said control signal to vary the magnitude of the output signal.

* * * * *

UNITED STATES PATENT AND TRADEMARK OFFICE
CERTIFICATE OF CORRECTION

PATENT NO. : 4,609,884

DATED : September 2, 1986

INVENTOR(S) : Kindinger, et al.

It is certified that error appears in the above-identified patent and that said Letters Patent is hereby corrected as shown below:

In the specification, column 1, line 18, delete the word "limiteu" and insert thereat --limited--.

Signed and Sealed this

Ninth Day of December, 1986

*Attest:*

DONALD J. QUIGG

*Attesting Officer*  Commissioner of Patents and Trademarks